US012429368B2

United States Patent
Sai et al.

(10) Patent No.: US 12,429,368 B2
(45) Date of Patent: Sep. 30, 2025

(54) IMAGING RADAR LEVEL GAUGE WITH ADAPTIVE BEAM STEERING CAPABILITY OPERATING UNDER HARSH CONDITIONS

(71) Applicant: Honeywell International Inc., Charlotte, NC (US)

(72) Inventors: Bin Sai, The Hague (NL); Marc M. Pos, Duvall, WA (US); Charan Ebsv, Telangana (IN)

(73) Assignee: Honeywell International Inc., Charlotte, NC (US)

( * ) Notice: Subject to any disclaimer, the term of this patent is extended or adjusted under 35 U.S.C. 154(b) by 486 days.

(21) Appl. No.: 17/571,475

(22) Filed: Jan. 8, 2022

(65) Prior Publication Data

US 2023/0221163 A1 Jul. 13, 2023

(51) Int. Cl.
*G01F 23/284* (2006.01)
*G01S 13/42* (2006.01)
*H03L 7/099* (2006.01)

(52) U.S. Cl.
CPC .......... *G01F 23/284* (2013.01); *G01S 13/426* (2013.01); *H03L 7/099* (2013.01)

(58) Field of Classification Search
CPC ....... G01F 23/284; G01S 13/426; H03L 7/099
See application file for complete search history.

(56) References Cited

U.S. PATENT DOCUMENTS

| 7,830,302 | B1 | 11/2010 | Smith, Jr. |
| 9,329,074 | B2 | 5/2016 | Sai |
| 10,050,726 | B2 | 8/2018 | Welle et al. |
| 11,063,368 | B2 | 7/2021 | Welle et al. |
| 2002/0154052 | A1* | 10/2002 | Fehrenbach ......... G01F 23/284 342/124 |
| 2004/0031335 | A1 | 2/2004 | Fromme et al. |
| 2007/0109177 | A1 | 5/2007 | Baath et al. |

(Continued)

FOREIGN PATENT DOCUMENTS

WO 0214803 A1 2/2002

OTHER PUBLICATIONS

"2021 Suez Canal Obstruction," Retrieved from "https://en.wikipedia.org/w/index.php?title=2021_Suez_Canal_obstruction&oldid=1047231080", page last edited on Sep. 29, 2021, at 18:24 (UTC).

(Continued)

*Primary Examiner* — Vladimir Magloire
*Assistant Examiner* — Nazra Nur Waheed
(74) *Attorney, Agent, or Firm* — KPPB Law; Luis M. Ortiz; Kermit D. Lopez

(57) ABSTRACT

In an embodiment, a radar level gauge system can include an antenna system comprising an imaging phased array in an isolated antenna arrangement that supports monopulse processing for radar image resolution and mapping of a surface of a material. The imaging phased array can provide a narrow-beam with beam scanning/steering and can emit a transmit beam that scans the surface of the material and forms the mapping of the surface. The mapping can comprise a 3D volumetric model that can include an image of a surface profile of the surface based on signals returned from the surface. The imaging phase array and the antenna system are protected from condensation and contamination from chemicals and viscous materials.

15 Claims, 5 Drawing Sheets

(56) References Cited

U.S. PATENT DOCUMENTS

| | | | |
|---|---|---|---|
| 2011/0102243 A1* | 5/2011 | Sai | G01S 13/36 |
| | | | 342/195 |
| 2012/0281096 A1* | 11/2012 | Gellaboina | G01S 15/88 |
| | | | 342/179 |
| 2013/0269430 A1 | 10/2013 | Manduit et al. | |
| 2015/0160067 A1 | 6/2015 | Sai | |
| 2016/0114867 A1 | 4/2016 | Nicol | |
| 2019/0107426 A1 | 4/2019 | Welle et al. | |
| 2019/0107427 A1* | 4/2019 | Waelde | G01S 13/88 |
| 2021/0262847 A1 | 8/2021 | Fredriksson et al. | |
| 2022/0049985 A1* | 2/2022 | Nilsson | H02H 9/008 |

OTHER PUBLICATIONS

"Honeywell Forget Asset Performance Management", 2019 Honeywell International Inc.
"Honeywell Forge", Honeywell International Inc.
"Measuring Beam Width" LIMACO radar level transmitters, 2021 LIMACO.
Salvador et al: Benefits of Digital Phased Array Radars, Proceedings of the IEEE, IEEE. New York, US, vol. 104, No. 3, Mar. 1, 2016 (Mar. 1, 2016), pp. 530-543.
Raghu Al:" 3D ISAR Imaging Algorithm Based on Amplitude Monopulse Processing at W Band", 2019 IEEE International Symposium on Phased Array System & Technology (PAST), IEEE, Oct. 15, 2019 (Oct. 15, 2019), pp. 1-6,.
European search Report for corresponding EP Application No. 22215482.5.

* cited by examiner

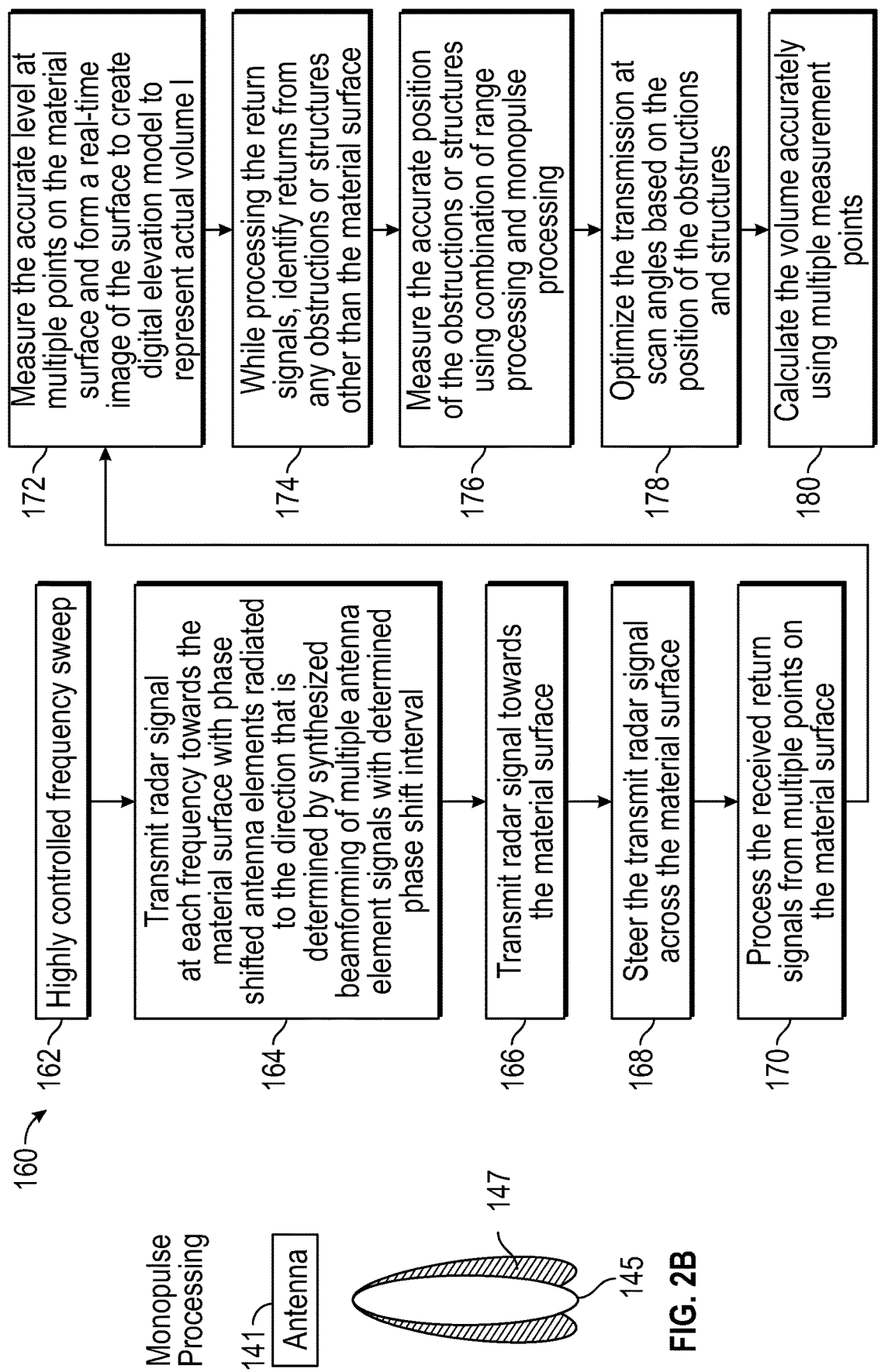

IMAGING RADAR LEVEL GAUGE WITH ADAPTIVE BEAM STEERING CAPABILITY OPERATING UNDER HARSH CONDITIONS

TECHNICAL FIELD

Embodiments are generally related to radar systems including radar level gauge (RLG) systems. More specifically, the embodiments relate to advanced imaging radar level gauge systems and applications. Embodiments also relate to the use of an imaging radar level gauge with electronically controlled beam scanning and adaptive beam steering capability operating under harsh conditions including industrial and maritime and air transportation situations. Embodiments further relate to enhanced voyage safety in maritime and air transportation using advanced imaging radar level gauge systems. In particular, embodiments relate to cargo movement safety monitoring systems.

BACKGROUND

Processing facilities and other facilities routinely include tanks and vessels for storing liquid and/or solid materials. Often it is necessary or desirable to measure the amount of material stored in a tank and/or a vessel regardless of its surface profile of material. This volumetric content measurement or determination may be useful, for example, during loading of material into the tank or unloading of material from the tank. Nowadays, "custody transfers" and "weights and measures" of oil and high-value liquids often require highly accurate determination of volume or volume change based on very accurate measurements of level gauging instruments installed on roof of the tank, whereas the radar signals can be affected by tank wall reflections and/or by obstacles inside tanks, rough surface profile or fluctuation, even though, continuous monitoring of volumetric content of materials can be vital for efficient operations, in custody transfer, inventory management or process control applications.

Radar has been used as a type of non-contact product level gauge for several decades. A typical radar system can include a transmitter coupled to a radar antenna which is positioned above the product (e.g., a liquid or solid) for emitting electromagnetic wave signals to the product and a receiver coupled to the same antenna (or to another antenna) for receiving radar signals reflected from the product surface, as well as a signal processor for determining the product level on the basis of the emitted radar signals and the reflected radar signals. According to this method, the antenna driven by transmit circuitry emits a modulated radar wave which strikes an object or surface, for example a liquid surface. The object or surface reflects part of the emitted radar signal/wave back in the direction of the antenna, which receives and is coupled to receive circuitry that processes the reflected radar signal/wave.

Radar level gauge (RLG) systems are in wide use for determining the filling level of a product contained in a tank or outside in an open field. Level gauging devices including radar, servo, capacitive, magnetoactive, ultrasounds, float and tape, are used for measuring point to point distance by which the level is determined, then the volume of content is calculated at the assumption that the entire surface is flat which is not necessarily true in real-life world, especially liquid with high viscosity and all solids.

The transmitted electromagnetic signals are reflected at the surface of the product, and the reflected signals are received by a receiver or transceiver comprised in the radar level gauge. Based on the transmitted and reflected signals, the distance to the surface of the product can be determined. More particularly, the distance to the surface of the product can be determined based on the time between transmission of an electromagnetic signal and reception of the reflection thereof in the interface between the atmosphere in the tank and the product contained therein. In order to determine the actual filling level of the product, the distance from the antenna aperture to reflecting point on the surface of material is determined by measuring travel time or parameter equivalent to travel time and speed of the electromagnetic wave in the propagation medium.

Storage tanks are routinely used in tank farm facilities and other storage facilities to store oil or other materials. As another example, oil tankers and other transport vessels routinely include numerous tanks storing oil or other liquid and/or solid materials. Often it is necessary or desirable to measure the amount of material stored in the tank and/or the vessel. This may be useful, for example, during loading of material into the tank or unloading of material from the tank. As particular examples, "custody transfers" and "weights and measures" of oil often require highly accurate measurements from level gauging instruments installed on roof of the tank.

It has become more and more popular to use radar to measure the amount of material, since in non-contact radar sensing there is no moving parts and less maintenance effort and can measure a longer distance. In this approach, radar offers more flexibility in various tank content measurement scenarios. However, in real-world situations, all level gauges including radar level gauges can only measure point to point level at the assumption that the entire surface is flat, meanwhile non-contact radars are vulnerable to interferences caused by obstacles in the tanks like agitators, mixers, ladders, even tank wall, therefore their antennas have often encounter problems that restrain radar beam from being close to obstacles that interfere with target signals. This to a large extent can undermine the flexibility of installation. For example, the antenna may need to be placed as far as possible from the tank wall. In some cases, however, the tank's nozzles and openings are often close to the tank wall, rather than in the center of the tank, which complicates the placement of the antenna with respect to the tank wall.

A root cause of the problems that ordinary radar gauges face stems from the fact that the antenna beamwidth is not narrow enough, which is determined by the antenna aperture size for given operating frequency. However, the size cannot be arbitrarily large because the devices may be required to fit into the nozzles on the top of the tank. A typical nozzle size can be from 1" to 8", customers favor smaller antenna sizes which in turn results in wider beamwidth. Although increasing the operating frequency or using higher frequency radars could reduce beamwidth to certain extent while maintaining the same antenna size, studies show that the beamwidth (e.g., a few degrees at 80 GHz) is still not small enough (e.g., 2-deg full radar beam illumination can easily become disturbed by an obstruction within radius of 120 centimeters at 70 meters). To overcome the conflicting factors of small antenna size and narrow beam, the present inventors have devised a phased array imaging level radar as discussed with respect to the disclosed embodiments.

Phased array radar has the ability to produce very narrow beams and electronically steer the beams. The proposed solution is to use extremely multi-narrow beams to scan and pinpoint rough surfaces to create real-time 3D image of the surface that can directly measure volumetric data without moving antenna, the radar can electronically change beam steering direction over a wide FOV in high precision. The ability to steer the beam in very small increments will allow for precise mapping of the obstruction and accurate measurements of the contents surrounding the obstruction. In addition to steering the beam, a phased array radar system may be configured for monopulse processing. Through processing of the monopulse information, the antenna beam can be artificially sharpened (e.g., a 1:10 reduction in beamwidths is achievable). As an example, a 10 degree beam can be reduced to approximately 1 degree through monopulse processing.

Another challenging problem in level sensing involves accurately determining the volumetric content in tanks and vessels. This is generally difficult for all level measurement devices because they are based on point to point determination, particularly if the surface of the content is not flat, which can be true for liquid materials with high viscosity and solid materials with pyramid shape. The phased array imaging radar makes it possible to conduct the volume determination using many measurement points of the surface to create a real-time image of the (rough) surface, enhancing the measurement accuracy to reduce the volumetric errors that can impact, for example, financial transactions in trade, especially for highly valued materials. There is currently no such device or method available, which can measure multiple points or image the content surface, because the antenna is fixed and prohibited frictions in mechanical movement for safety provisions in hazardous and explosive environments and the antenna beamwidth with smaller aperture sizes is not narrow enough to have small footprint.

Problems that suppliers and customers currently encounter with ordinary radar gauges include the need to mount existing radars with a fixed beams as far as possible from the wall of tanks/vessels. This type of mounting arrangement. is difficult to install. In addition, the tank wall's effect has a significant impact on accuracy for conventional radars.

An alternative solution can involve the use of stillwell/pipe radar to avoid reflection from the tank wall but is subject to the costly installation of pipe through the vessels and in addition, high viscous liquids and solids may not be able to enter the stillpipe through the small holes and slots on the stillpipe, thereby preventing the content from rising or falling in a timely manner to the level of the viscous liquids or solids inside the stillpipe.

Another application in tank management involves monitoring sludge/sediment distribution and accumulation over time. Sludge and sediment can take up the useful space of storing useful material, and often manual or visual inspection of sediment/sludge in tanks can also result in lengthy downtimes. In addition, conventional level gauging approaches currently do not offer an extremely narrow beam and beam steering in a level gauge to avoid obstructions, therefore it cannot replace tedious manual dipping and point/contact measurements.

In maritime transportation involving, for example, tankers, Very Large Crude Carrier (VLCC) and Ultra Large Crude Carrier (ULCC), or container ships, and even in air transportation, it is always desirable to ensure that vessels carrying liquids are stable and safe under harsh weather conditions. Examples include crude oils, petrochemical in onboard cargo tanks and liquid in ballast tanks.

In real-world situations conventional radar level gauges may only measure a point to point level, and their antenna beamwidth is not narrow enough to cope with obstacles in the tank. Because the antenna cannot be arbitrarily large, they must fit within the nozzles on the top of the tank, especially in the case ballast tanks, which usually have small nozzles <2 inch. In addition, the usage of level sensing actually can determine volumetric content in tanks and vessels, and this is difficult using current level measurement devices, particularly if the surface of content is not flat, which can be true for liquid materials with high viscosity and solid materials. Liquids within onboard maritime tanks can be exposed to radical movement causing safety concerns in adverse situations and may be subject to errors in liquid level measurements based on single point measurements.

As noted above, devices, systems or methods have not been developed and implemented, which can measure multiple points or image content surface with fixed radar antenna installation. Besides commonly encountered challenges in level sensing applications, in maritime applications the safety of fleet and its cargos under harsh weather conditions represents another challenge, that is, how to make a connection between weather impacts on cargos inside tanks. This problem has not been addressed by conventional tank measurement approaches. One can imagine that during a storm, for example, onboard goods can become damaged. Vessels themselves may be impacted severely. One recent example is the large container ship that became grounded in the Suez Canal during a sandstorm.

BRIEF SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is, therefore, one aspect of the embodiments to provide for improved radar sensing systems, devices, and methods.

It is another aspect of the embodiments to provide for methods, systems and devices for implementing advanced imaging radar level gauge systems and applications.

It is a further aspect of the embodiments to provide for methods, systems, and devices involving the use of an imaging radar level gauge with adaptive beam steering capability operating under harsh conditions.

It is also an aspect of the embodiments to provide for an integrated cargo movement safety monitoring system.

The aforementioned aspects and other objectives can now be achieved as described herein. In an embodiment, a radar level gauge system, can include an antenna system comprising an imaging phased array in an isolated antenna arrangement that supports monopulse processing for radar image resolution and mapping of a surface of a material. The imaging phased array can provide a narrow-beam with beam scanning/steering and can emit at least one transmit beam that can scan the surface of the material and form the mapping of the surface, the mapping comprising a 3D volumetric model that can include an image of a surface profile of the surface based on signals returned from the surface. The imaging phase array and the antenna system are protected from condensation and contamination from chemicals and viscous materials.

In an embodiment of the radar level gauge system, the 3D volumetric model can include data indicative of a height, a slope and horizontal dimensions with respect to the material and the surface of the material.

In an embodiment of the radar level gauge system, the material can be contained in, for example, a tank or a field in open air.

In an embodiment of the radar level gauge system, the isolated antenna arrangement can be intrinsically safe and galvanic isolated.

In an embodiment of the radar level gauge system, the antenna system can further include a plurality of receive antenna elements and a plurality of transmit antenna elements.

An embodiment of the radar level gauge system can further include a phased-lock loop (PLL) circuit that can facilitate PLL wideband level radar with galvanic isolation gauging for the isolated antenna arrangement.

An embodiment of the radar level gauge system can further include processing circuitry that outputs a signal that is fed as input to the PLL circuit, wherein the PLL circuit provides a signal to a voltage controlled oscillator circuit; a plurality of low noise amplifiers electrically connected to the plurality of receive antenna elements and a plurality of mixers electrically connected to the plurality of low noise amplifiers; a plurality of phase shifters connected electronically to the plurality of mixers, wherein the plurality of mixers output signals that are fed as input to the plurality of phase shifters; and a plurality of amplifiers connected electronically to the plurality of phase shifters, wherein the plurality of amplifiers provides signals to a multi-channel analog-to-digital converter, which in turn output signals that are input to the processing circuitry.

In an embodiment of the radar level gauge system, azimuth and elevation monopulse signals can be used to determine a location of obstruction reflectors that interfere with target signals emitted by the imaging phased array of the antenna system.

An embodiment of the radar level gauge system can further include a power management module that provides power management signals to the radar level gauge system.

An embodiment of the radar level gauge system can further include a communications module that communicates bidirectionally with the radar level gauge system and facilitates communication with a data network.

In another embodiment, a method of operating a radar level gauge system, can involve: providing an antenna system comprising an imaging phased array in an isolated antenna arrangement that supports monopulse processing for radar image resolution and mapping of a surface of a material; generating from the imaging phased array a narrow-beam with beam scanning/steering; and emitting at least one transmit beam that scans the surface of the material and forms the mapping of the surface, the mapping comprising a 3D volumetric model that includes an image of a surface profile of the surface based on signals returned from the surface.

In an embodiment of the method, the imaging phase array and the antenna system are protected from condensation and contamination from chemicals and viscous materials.

An embodiment of the method can involve providing from the 3D volumetric model, data indicative of a height, a slope and horizontal dimensions with respect to the material and the surface of the material.

In an embodiment of the method, the material can be contained in at least one of: a tank or a field in open air; and the isolated antenna arrangement is intrinsically safe and galvanic isolated.

In an embodiment of the method, the antenna system can comprise a plurality of receive antenna elements and a plurality of transmit antenna elements.

In another embodiment, an integrated cargo movement safety monitoring system, can include a real-time radar level gauge system that includes a plurality of imaging phased array radars installed on at least one inboard cargo tank in a vessel that supports monopulse processing for radar image resolution and mapping of a surface of a material contained in the at least one inboard cargo tank, wherein the imaging phased array provides a narrow-beam with beam scanning/steering and emits at least one transmit beam that scans the surface of the material and forms an image of the surface including a fluctuation of the surface based on signals returned from the surface.

In an embodiment of the integrated cargo movement safety monitoring system, the weather data can be obtained from maritime weather stations and/or aeronautical weather stations and used for real-time cargo monitoring to provide data indicative of a cargo tank situation with respect to the at least one inboard cargo tank in the vessel.

An embodiment of the integrated cargo movement safety monitoring system can further include a data integrated linkage and a cross-correlation between real-time level monitoring data and weather/tide data, wherein the data integrated linkage is used to assess impact correlated severity with adverse conditions with respect to the at least one inboard cargo tank in the vessel.

An embodiment of the integrated cargo movement safety monitoring system can further include a communications module for broadcasting underlining impact factors with respect to the at least one inboard cargo tank in the vessel for others to use the underlining impact factors to optimize and/or divert a current voyage route to a safer voyage route.

An embodiment of the integrated cargo movement safety monitoring system can further include an onboard human machine interface located on the vessel that communicates with a cloud-based server.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the principles of the embodiments.

FIG. 2B illustrates a beam pattern of the antenna shown in FIG. 2A with monopulse processing, in accordance with an embodiment;

FIG. 3 illustrates a flow chart of operations depicting logical operational steps of a method for imaging radar level gauge measurement with adaptive beam steering capability operating under harsh conditions, in accordance with an embodiment;

Like reference symbols or reference numerals in the various drawings indicate like elements.

DETAILED DESCRIPTION

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in an embodiment" or "in one embodiment" or "in an example embodiment" and variations thereof as utilized herein may or may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1C:
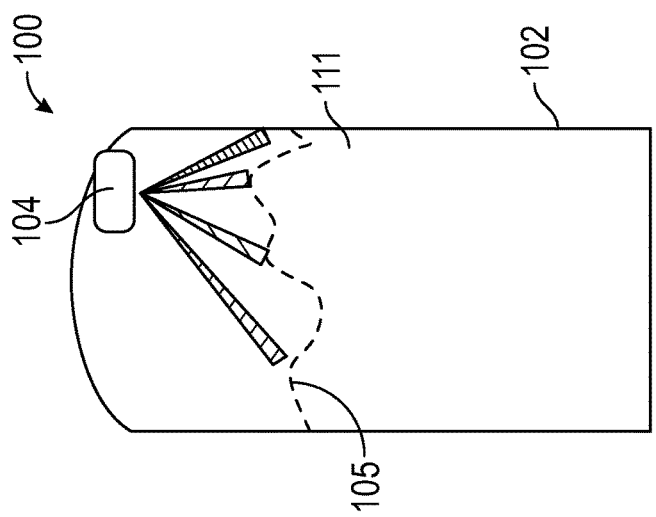
FIG. 1C illustrates a schematic diagram of the imaging radar level gauge system depicted in FIG. 1A and FIG. 1B in an optimal installation position, in accordance with an embodiment.
Figure 1B:
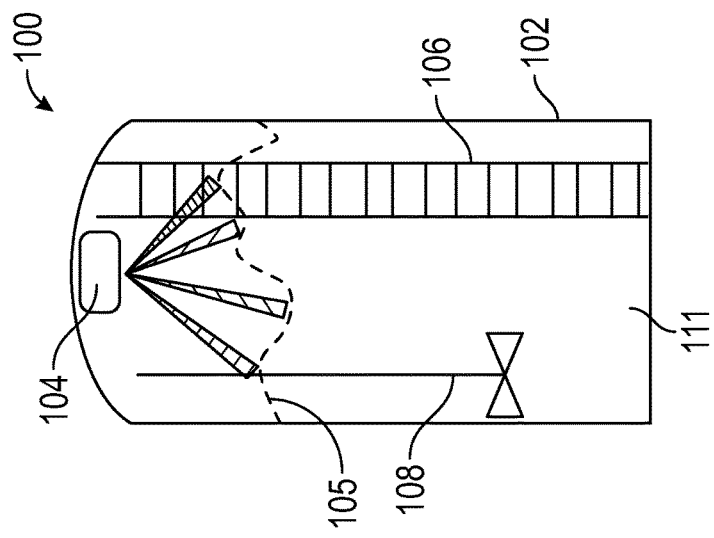
FIG. 1B illustrates a schematic diagram of the imaging radar level gauge system depicted in FIG. 1A, which can accurately perform measurement in environments with multiple obstructions, in accordance with another embodiment.
Figure 1A:
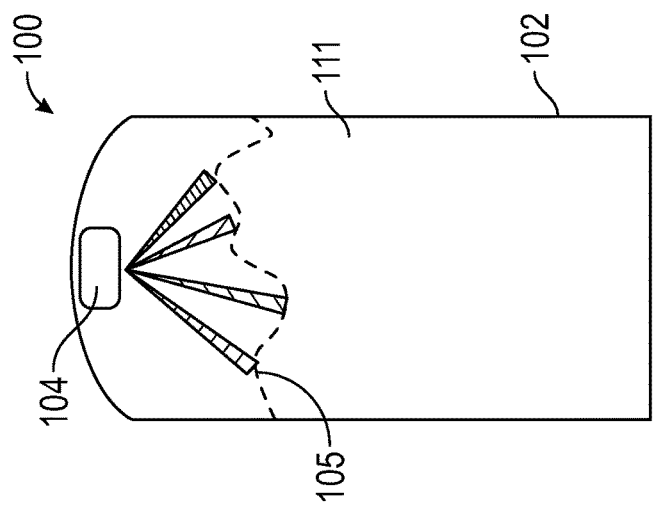
FIG. 1A illustrates a schematic diagram of an imaging radar level gauge system for measuring points on a surface of a material contained in a tank, in accordance with an embodiment.

FIG. 1A illustrates a schematic diagram of an imaging radar level gauge system 100 for measuring points on a surface 105 of a material 111 contained in a tank 102, in accordance with an embodiment. As shown in FIG. 1A, the imaging radar level gauge system 100 can include a radar level gauge apparatus 104. Note that the terms 'radar level gauge apparatus' and 'radar level gauge" can be utilized interchangeably herein to refer to the same device, apparatus, or system.

In the radar level gauge apparatus 104, phase array radar can increase measurement points on the surface 105 of the material 111 contained in the tank 102. The material 111 may be, for example, a liquid (e.g., bitumen, crude oil, etc.), and/or a solid (e.g., cements, powders, sediment, sludge, etc.). In an embodiment, the tank 102 may be, for example, a transportation tank such as used in a sea-going vessel such as an oil tanker. In another embodiment, the tank 102 may be a storage tank such as utilized in a hydrocarbon storage and/r processing facility.

FIG. 1B illustrates a schematic diagram of the imaging radar level gauge system 100 depicted in FIG. 1A, which can accurately perform measurement in environments with multiple obstructions, in accordance with another embodiment. Examples of multiple obstructions in the tank 102 can include an agitator 108 and a ladder 106. Despite these obstructions, the radar level gauge apparatus 104 can perform accurate measurements with respect to the surface 105 of the material 111.

FIG. 1C illustrates a schematic diagram of the imaging radar level gauge system 100 depicted in FIG. 1A and FIG. 1B in a convenient installation position, in accordance with an embodiment. That is, the radar level gauge apparatus 104 can offer better/increased freedom for its installation position suitable for available nozzles on the roof of tanks which are often close to tank shell. In the example shown in FIG. 1C, the radar level gauge apparatus 104 is shown positioned at or near the top right side of the tank 102. It can be appreciated that the radar level gauge apparatus 104 may also be located at other convenient positions in the tank 102, such as at the top left side of the tank 102 or at the top middle section of the tank 102 as shown in FIG. 1A and FIG. 1B.

Figure 2A:
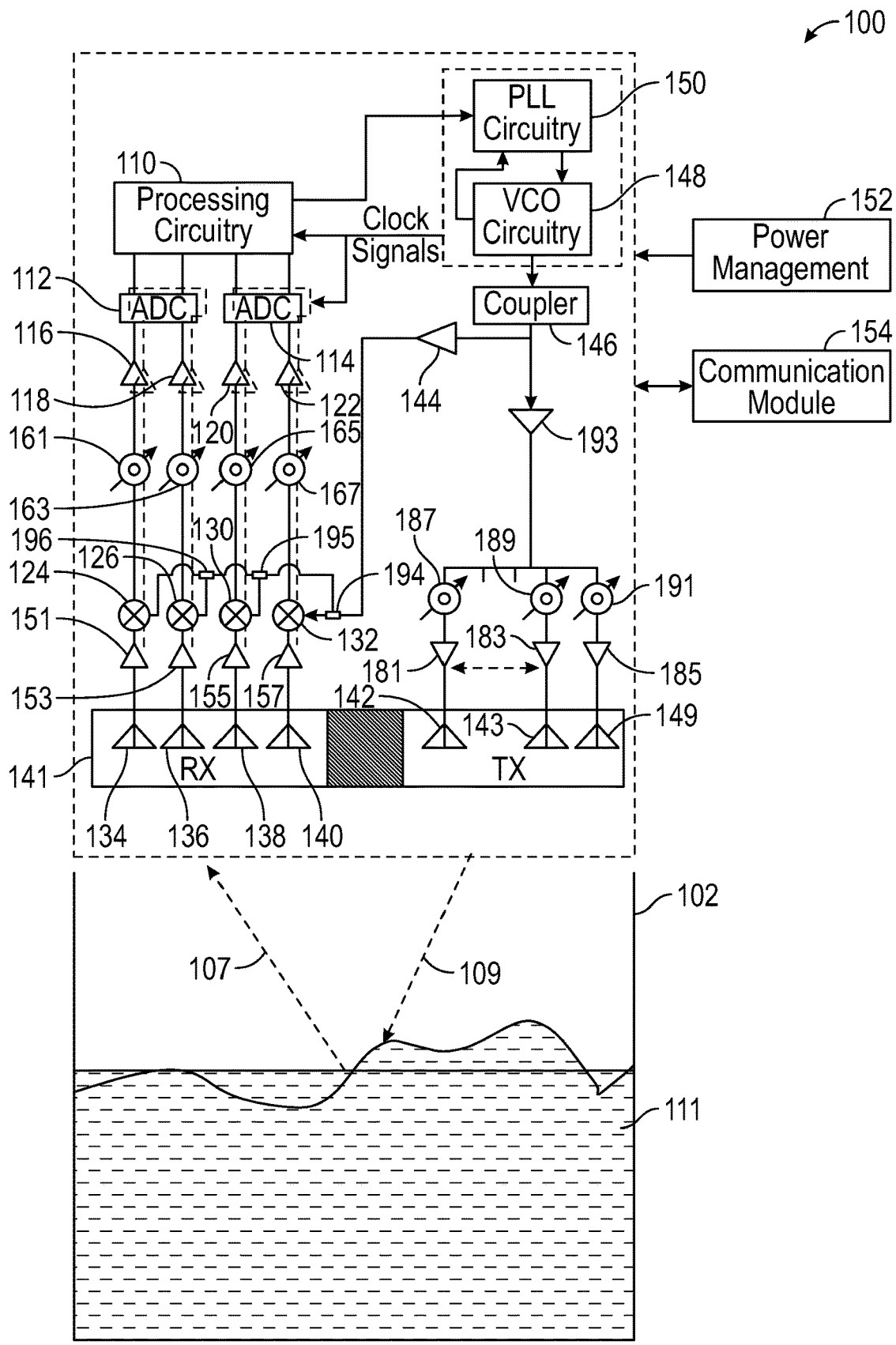
FIG. 2A illustrates a block diagram of the imaging radar level gauge system shown in FIG. 1A, FIG. 1B, and FIG. 1C, in accordance with an embodiment.

FIG. 2A illustrates a block diagram of the imaging radar level gauge system 100 shown in FIG. 1A, FIG. 1B, and FIG. 1C, in accordance with an embodiment. As discussed above, the imaging radar level gauge system 100 can include a radar level gauge apparatus 104 that can be positioned at or toward the top of the tank 102. The radar level gauge apparatus 104 can include an antenna system 141 that can include one or more receive antenna elements 134, 136, 138, 140, and multiple transmit antenna elements including transmit antenna elements 142, 143, 149, etc.

Note that in some embodiments, a minimum of four receivers and four antenna quadrants may be needed to perform monopulse operations for an imaging radar application. The imaging radar level gauge system 100 can include a minimum of four receive channels in order to facilitate monopulse processing capability. Correspondingly the receive antenna aperture can contain a minimum of four antenna groups configured in, for example, at least a 2×2 configuration to form Quadrants in Azimuth and Elevation. The delta Azimuth, delta Elevation channels as well as the Sum channel can be employed to determine the proximity of the point target's relation to the quadrant beams. This monopulse calculation can result in a 10:1 reduction in beam width. This can be a minimum requirement when deploying an imaging radar for an embodiment.

The receive antenna elements 134, 136, 138, and 140 can be respectively electrically connected to a Low Noise Amplifier (LNA) 153, LNA 155, LNA 157, and LNA 159.

The LNA 153, the LNA 155, the LNA 157, and the LNA 159 in turn can output signals that can be respectively fed as input to a mixer 124, a mixer 126, a mixer 130, and a mixer 132. The mixer 124, the mixer 126, the mixer 130, and the mixer 132 in turn can output signals that can be respectively fed as input to a phase shifter 161, a phase shifter 163, a phase shifter 165, and a phase shifter 167. The output signals from phase shifter 161, phase shifter 163, phase shifter 165, and phase shifter 167 can be fed as input to amplifier 116, amplifier 118, amplifier 120, and amplifier 122. The amplifier 116 and the amplifier 118 can provide output signals that can be fed electronically as input to a multi-channel analog-to-digital converter (ADC) 112. The amplifier 120 and the amplifier 122 likewise can provide output signals that can be fed electronically as input to a multi-channel analog-to-digital converter (AD) 114.

The transmit antenna elements 142, 143, 149 can be electronically connected to a power amplifier 181, a power amplifier 183, and a power amplifier 185. The power amplifier 181, the power amplifier 183, and the power amplifier 185 in turn can be electrically connected respectively to a phase shifter 187, a phase shifter 189, and a phase shifter 191. The phase shifter 187, the phase shifter 189, and the phase shifter 191 can be fed by output from an amplifier 193, which in turn can be fed by output from coupler the 146.

The radar level gauge apparatus 104 also can include a processing circuit 110, which can communicate electronically with the ADC 112 and the ADC 114. The processing circuit can be implemented by, for example, a processor, microcontroller, microprocessor, and so on. Output from the processing circuit 110 can be electronically fed as input to Phase-Locked Loop (PLL) circuit 150. That is, the processing circuit can communicate electronically with the PLL circuit 150.

The radar level gauge apparatus 104 can also include voltage-controlled oscillator (VCO) circuit 148 that can electronically receive as input electronic signals output from the PLL circuit 150. Output from the VCO circuit 148 can be provided electronically to the coupler 146 and back to the PLL circuit 150. The processing circuit 110 may be, for example, one or more processing devices such as a processor, microprocessor, a central processing unit, a controller, a microcontroller, and so on. Part of the signal output from the amplifier 144 coupled from the coupler 146 can be connected to a local oscillator input of mixer 132, 130, 126, 124 etc., using, for example, RF dividers/splitters 194, 195 and 196.

Note that the term 'circuit' and 'circuitry' as utilized herein may refer to the same feature. The term 'circuit' as utilized herein relates to electronic circuits, electrical circuits, and so on. The PLL circuit 150 and the VCO circuit 148 together can form a circuit that can provide output as clock signals to the ADS 114 and the processing circuit 110. That is, as shown in FIG. 2A, a dashed line surrounds the PLL circuit 150 and the VCO circuit 148, which indicates that the PLL circuit 150 and the VCO circuit 148 may be implemented as a circuit, which case the PLL circuit 150 and the VCO circuit 148 may comprise sub-circuits of the overall circuit indicated by the aforementioned dashed line.

The imaging radar level gauge system 100 can further include a power management module 152 that can provide power management signals to the radar level gauge apparatus 104. A communications module 154 can also communicate bidirectionally with the radar level gauge apparatus 104 as shown in FIG. 2A. The communications module 154 can be, for example, a wired (e.g., 4-20 mA, Modbus, FF, etc.), and a wireless (e.g., Wi-Fi, cellular, etc.) communications module that can provide bidirectional communication with a wireless network (e.g., a Wi-Fi network, a cellular communications network, etc.). The communications module 154 can communicates bidirectionally with the radar level gauge apparatus 104 of the imaging radar level gauge system 100 and facilitates communication with a data network (e.g., such as the wireless network discussed above).

The radar level gauge apparatus 104 of the imaging radar level gauge system 100 can be implemented in some embodiments as a device and/or system that can include software defined radar technology. For example, the PLL circuit 150 can facilitate a robust PLL-controlled wideband level radar (e.g., 1-4 GHz BW) with galvanic isolation gauging in hazardous areas in some cases. The antenna system 141 and components of the imaging radar level gauge system 100 can thus be implemented in an isolated antenna arrangement that is intrinsically safe and galvanic isolated and robust against contamination and condensation caused by nearby materials. Note that the term 'intrinsically safe' and various thereof as utilized herein relates to intrinsically safe equipment and intrinsically safe standards for equipment and wiring which is incapable of releasing sufficient electrical or thermal energy under normal or abnormal conditions to cause ignition of a specific hazardous atmospheric mixture in its most easily ignited concentration.

The radar level gauge apparatus 104 can include advanced radar signal processing providing (sub) mm accuracy over an entire gauging range can be facilitated by the processing circuit 110. The radar level gauge apparatus 104 can provide phased array radar combined advanced signal processing technology and a low-cost design to provide optimal differentiated solution to civil and industrial applications. The radar level gauge apparatus 104 additionally can provide an ultra-narrow-beam and ultra-wide-band with beam scanning/steering to provide imaging and level mapping of uneven surfaces and digital model (e.g., software upgrade as a service) as additional measuring capability/algorithms are developed.

The radar level gauge apparatus 104 can be implemented as a low-cost phased array radar that can cope with the problems previously discussed herein. Conventional phased array radar is costly and large in size for industrial applications. Miniaturized phase array radar, however, can not only provide narrow beamwidth and beam steering capabilities, but can also function efficiently in harsh and hazardous conditions such as, for example, ATEX provisions for safety regulations and galvanic isolation requirements in tank containing flammable materials. The antenna surface must also be protected to enable functions of anti-static and anti-contamination and anti-aggressive chemicals, while maintaining a high-performance and low return loss. Note that the term ATEX relates to European Union (EU) directives describing the minimum safety requirements for workplace and equipment used in explosive atmospheres. 'ATEX" is an acronym for the French term Appareils destinés à être utilisés en ATmosphéres EXplosives (French for "Equipment intended for use in explosive atmospheres"). ATEX is referred to herein for exemplary purposes only and as an example of an intrinsically safe standard and is not considered a limiting feature of the embodiments.

The radar level gauge apparatus 104 can utilize a low-cost low power Imaging phased array radar sensor with adaptive beam steering capability to map the surface of the material 111 (liquids or solids) in the tank 102 including obstacles and structures such as the agitator 108 and the ladder 106 depicted in FIG. 1B. Highly accurate beam steering over a wide field of view (FOV) can be achieved using a combination of analog and digital beam forming techniques and/or highly integrated customized RF system on chips (SoC) such as shown in the block diagram in FIG. 2A.

The various components of the radar level gauge apparatus 104 shown in FIG. 2A can form a novel imaging phased array capable of supporting monopulse processing for improved radar image resolution and more accurate mapping the surface. A different view of the tank 102 shown in FIG. 1A, FIG. 1B, and FIG. 1B is also depicted in FIG. 2A, including dashed arrows 107 and 108, which may represent measurement performed by the system 100 with respect of the material 111 contained in the tank 102.

FIG. 2B illustrates a beam pattern of the antenna system 141 shown in FIG. 2A with monopulse processing, in accordance with an embodiment. As shown in the beam pattern depicted in FIG. 2B, the antenna system 141 can implement a difference signal 147 and a sum signal 145.

The phase array of the radar level gauge apparatus 104 can emit one or more transmit beams and scan electronically. Multiple receive beam forms can be formed simultaneously. The radar beam emitted by the radar level gauge apparatus 104 can scan the surface of the tank 102 and can form an image of the surface based on the return signals. The electronically scanned radar of the radar level gauge apparatus 104 can support fast scanning rates and can help with obtaining faster radar images for dynamic fast filling applications as well. The azimuth and elevation monopulse signals (i.e., difference signal 147 and a sum signal 145) can be used to determine the precise location of discrete reflectors such as agitators, mixers, ladders, even tank wall and obstacles that interfere with target signals.

Based on the analysis of unwanted reflections, optimum beam position can be determined to minimize the reflections and obtain more accurate level and contour measurements of the material surface. If the beam cannot avoid the obstacle due to an installation/measurement constraints, the exact range, angle of each of the obstruction is measured and differentiated from the target return. In this case the radar can be used to measure movement of known obstructions such as, for example, the agitator 108 depicted in FIG. 1B. This will provide another measurement of speed and or verify expected movement of the agitator 108. The information is in particular useful as (empty) tank spectrum in advanced signal processing to enhance the overall accuracy robustness against interferences caused by obstructions.

The radar level gauge apparatus 104 can be implemented as a low cost device/system. Furthermore, the radar level gauge apparatus 104 can be used in harsh environments such as in shipping and air transportation and can operate with low-power consumption in hazardous areas requiring stringent safety provisions such as ATEX and FM certified approvals. The radar level gauge apparatus 104 can also be implemented in the context of an apparatus/system compliant with frequency regulations across main markets. The radar level gauge apparatus 104 can also meet EMC, IP 65-68, and International Organization of Legal Metrology (OIML) approvals, as well as SIL2 and 3 approvals.

FIG. 3 illustrates an exemplary flow chart of operations depicting logical operational steps of a method 160 for imaging radar level gauge measurement with adaptive beam steering capability operating under harsh conditions, in accordance with an embodiment. As indicated at block 162, a step or operation (instruction) can be processed to implement a high-controlled frequency sweep using with the radar level gauge apparatus 104.

Then, as shown at block 164, a step or operation can be implemented to transmit radar signal(s) from the radar level gauge apparatus 104 at each frequency toward the material surface 105 with phase shifted antenna elements (i.e., elements of the antenna system 141) radiated to the direction that can be determined by synthesized beamforming of multiple antenna element signals with a determined phase shift interval. Next, as illustrated at block 166, a step or operation can be implemented to transmit the radar signal towards the material surface 105.

Thereafter, as depicted at block 168, a step or operation can be implemented to steer the transmit radar signal across the material surface 105. Then, as shown at block 170, a step or operation can be implemented to process (e.g., with the processing circuit 110), the received return signals from multiple points on the material surface 105. Next, as described at block 172, a step or operation can be implemented to measure the accurate level at multiple points on the material surface 105 and form a real-time image of the surface 105 to create a digital elevation model to represent the actual volume.

Then, as shown at block 174, a step or operation can be implemented in which, while processing the return signals, returns are identified from any obstructions or structures other than the material surface 105. Thereafter, as indicated at block 176, a step or operation can be implemented to measure the accurate position of the obstructions or structures using a combination of range processing and monopulse processing. Next, as shown at block 178, a step or operation can be implemented to optimize the transmission at scan angles based on the position of the obstructions and structures. Finally, as shown at block 180, a step or operation can be implemented to calculate the volume accurately using multiple measurement points.

The embodiments can be implemented in a number of applications. Air and maritime transportation systems represent a possible application of the embodiments. As discussed, advanced imaging radar gauge with narrow beam scanning can be used to measure many measurement points on the surface of liquid to create real-time image of the (rough) surface. The antenna can be mechanically fixed, and the beam steering can be controlled electronically using a phased array. In this way radar can continuously monitor waved surface to provide data to control room to assess the real-time situation.

The embodiments can provide not only the level of content, but also the change of surface to create dynamic mapping of turbulent movement of liquid inside the ballast and/or cargo tanks could be used along with weather and tide data obtained elsewhere to determine optimal routes.

The phased array radar can scan across the volume of liquid and map not only the level but the contour of the liquid. The contour will map the disturbance of the surface and the overall slope of the liquid. The radar scans the surface continuously and updates the contour of the liquid rapidly. The update rate may depend on the size of the tank and or number of radar units used. A single radar may be capable of scanning an area of 110 degrees by 30 degrees when viewed from the top of the tank. Multiple radars can increase the update rate and coverage area. For example, Honeywell's RDR-84K can be networked together and up to 7 radars can be used in a single tank without interference concerns. The turbulence of the liquid will indicate the sea state level. It is envisioned that over time the turbulence of the liquid can be related to specific sea state levels. This data collected by the radar can be transmitted to a network such as the Honeywell Forge Cloud. This can enable further analysis and sharing of data. The analysis can indicate where sea states are more optimal and advice other vessels.

This data can enable optimization of routes. This optimization can minimize fuel consumption and reduce wear and tear of the vessels. The aforementioned Honeywell Forge Cloud, for example, can also be leveraged to advice vessels without this capability. This in turn can be used at dock for safety and or alerting purposes, or when loading the vessel to alter that rate of loading. Minimize wear and tear on the vessel and a dock structure.

As can be appreciated by one skilled in the art, embodiments can be implemented in the context of a method, data processing system, or computer program product. Accordingly, embodiments may take the form of an entirely hardware embodiment, an entirely software embodiment or an embodiment combining software and hardware aspects all generally referred to herein as a "circuit" or "module." Furthermore, embodiments may in some cases take the form of a computer program product on a computer-usable storage medium having computer-usable program code embodied in the medium. Any suitable computer readable medium may be utilized including hard disks, USB Flash Drives, DVDs, CD-ROMs, optical storage devices, magnetic storage devices, server storage, databases, etc. Examples of a module which may be implemented as hardware, software or a combination of hardware and software include the power management module 152 and communication module 154 shown in FIG. 2A.

Computer program code for carrying out operations of the embodiments may be written in, for example, an object oriented programming language (e.g., Java, C++, etc.). The computer program code, however, for carrying out operations of the embodiments may also be written in procedural programming languages, such as the "C" programming language or in a visually oriented programming environment, such as, for example, Visual Basic.

The program code may execute entirely on the user's computer, partly on the user's computer, as a stand-alone software package, partly on the user's computer and partly on a remote computer or entirely on the remote computer. In the latter scenario, the remote computer may be connected to a user's computer through a bidirectional data communications network such as a local area network (LAN) or a wide area network (WAN), a wireless local area network (WLAN), wireless data network e.g., Wi-Fi, Wimax, 802.xx, and/or a cellular network or the bidirectional connection may be made to an external computer via most third party supported networks (for example, through the Internet utilizing an Internet Service Provider).

Some embodiments are described at least in part herein with reference to flowchart illustrations and/or block diagrams of methods, systems, and computer program products and data structures. It will be understood that each block or feature of the illustrations, and combinations of blocks or features, can be implemented by computer program instructions. For example, computer program instructions may implement the various steps, operations or instructions shown in FIG. 3 with respect to block 162 to block 180.

These computer program instructions may be provided to a processor of, for example, a general-purpose computer, special-purpose computer, or other programmable data processing apparatus to produce a machine, such that the instructions, which executed via the processor of the computer or other programmable data processing apparatus, create means for implementing the functions/acts specified in the block or blocks or elsewhere herein. Examples of the aforementioned processor include the processing circuit 110 depicted in FIG. 2A and the processor 349 and/or the CPU 341 illustrated in FIG. 4.

The disclosed embodiments can be implemented in the context of, for example a special-purpose computer or a general-purpose computer, or other programmable data processing apparatus or system. For example, in some embodiments, a data processing apparatus or system can be implemented as a combination of a special-purpose computer and a general-purpose computer. These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the various block or blocks, flowcharts, and other architecture illustrated and described herein. An example of the aforementioned computer-readable memory is the memory 342 shown in FIG. 4.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks. Such a computer or other programmable data processing apparatus may be utilized to control the functionality of, for example, the radar level gauge apparatus 104 and/or specific components of the radar level gauge apparatus 104, such as, for example, the antenna system 141, etc.

The flowchart and block diagrams in the figures herein illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 4:
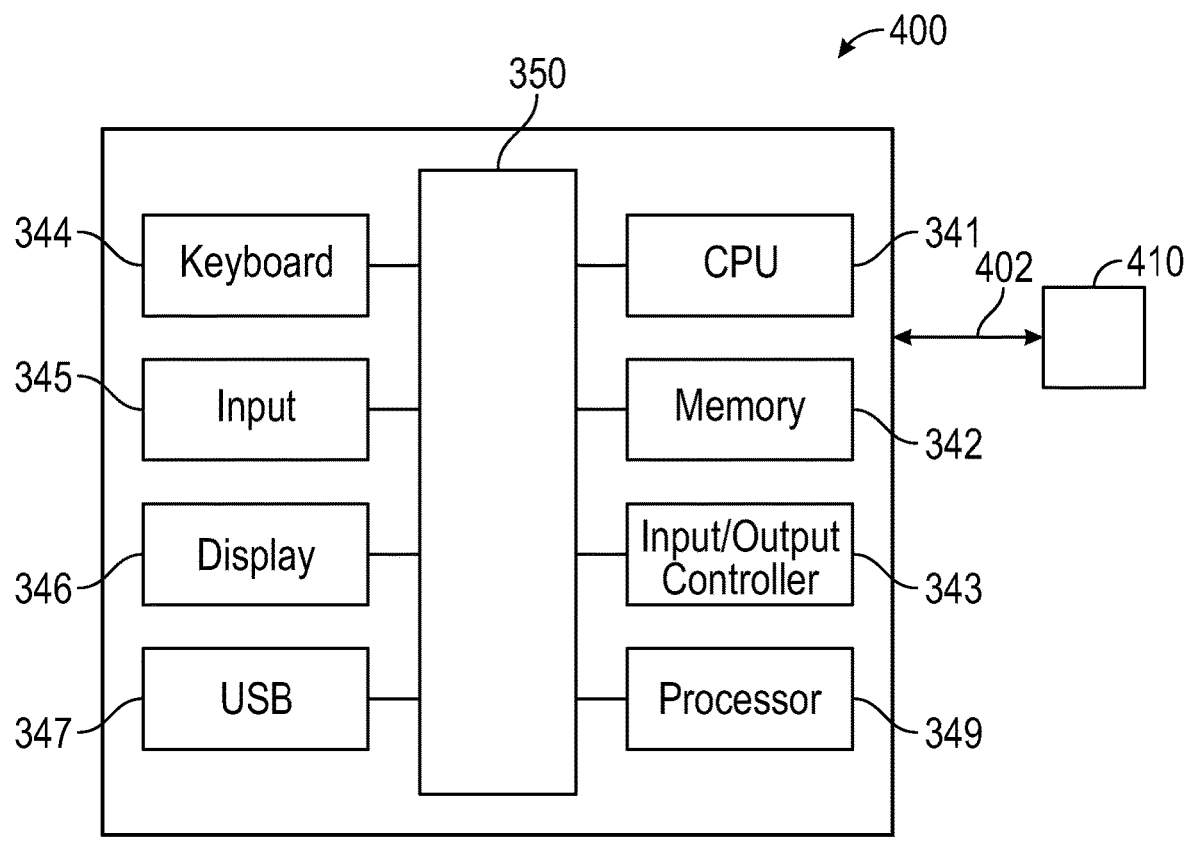
FIG. 4 illustrates a schematic view of a data-processing system, in accordance with an embodiment.
Figure 5:
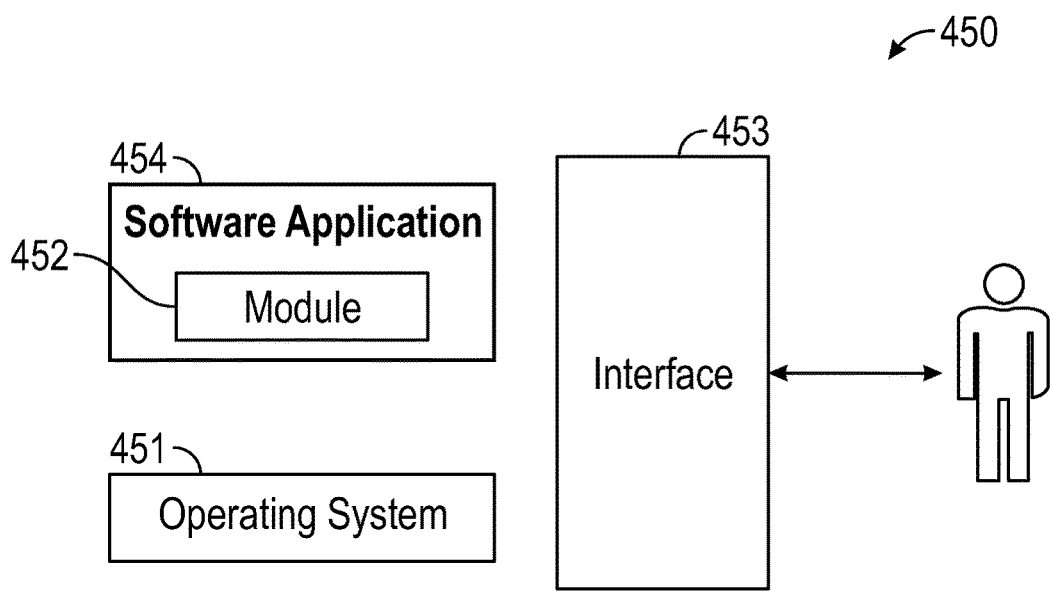
FIG. 5 illustrates a schematic view of a software system including a module, an operating system, and a user interface, in accordance with an embodiment.

FIG. 4 and FIG. 5 are shown only as exemplary diagrams of data-processing environments in which example embodiments may be implemented. It should be appreciated that FIG. 4 and FIG. 5 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

As illustrated in FIG. 4, an embodiment may be implemented in the context of a data-processing system 400 that can include, for example, one or more processors such as a CPU (Central Processing Unit) 341 and/or other another processor 349 (e.g., microprocessor, microcontroller, etc.), a memory 342, an input/output controller 343, a peripheral USB (Universal Serial Bus) connection 347, a keyboard 344 and/or another input device 345 (e.g., a pointing device, such as a mouse, track ball, pen device, etc.), a display 346 (e.g., a monitor, touch screen display, etc.) and/or other peripheral connections and components.

As illustrated, the various components of data-processing system 400 can communicate electronically through a system bus 350 or similar architecture. The system bus 350 may be, for example, a subsystem that transfers data between, for example, computer components within data-processing system 400 or to and from other data-processing devices, components, computers, etc. The data-processing system 400 may be implemented in some embodiments as, for example, a server in a client-server based network (e.g., the Internet) or in the context of a client and a server (i.e., where aspects are practiced on the client and the server).

In some example embodiments, data-processing system 400 may be, for example, a standalone desktop computer, a laptop computer, a smartphone, a tablet computing device, a networked computer server, and so on, wherein each such device can be operably connected to and/or in communication with a client-server based network or other types of networks (e.g., cellular networks, Wi-Fi, etc.). The data-processing system 400 can communicate with other devices such as, for example, an electronic device 410. Communication between the data-processing system 400 and the electronic device 410 can be bidirectional, as indicated by the double arrow 402. Such bidirectional communications may be facilitated by, for example, a computer network, including wireless bidirectional data communications networks.

FIG. 5 illustrates a computer software system 450 for directing the operation of the data-processing system 400 depicted in FIG. 4. Software application 454, stored for example in the memory 342 can include one or more modules such as module 452. The computer software system 450 also can include a kernel or operating system 451 and a shell or interface 453. One or more application programs, such as software application 454, may be "loaded" (i.e., transferred from, for example, mass storage or another memory location into the memory 342) for execution by the data-processing system 400. The data-processing system 400 can receive user commands and data through the interface 453; these inputs may then be acted upon by the data-processing system 400 in accordance with instructions from operating system 451 and/or software application 454.

The interface 453 in some embodiments can serve to display results, whereupon a user (represented as a figure of a person at the right side of FIG. 4) may supply additional inputs or terminate a session. The interface 453 may be a user interface such as a graphical user interface (GUI). The software application 454 can include module(s) 452, which can, for example, implement instructions, steps or operations such as those discussed herein. Examples of such instructions, steps or operations include the various instructions, steps and/or operations shown in FIG. 3 at blocks 162, 164, 166, 168, 170, 172, 174, 176, 178 and/or 180. Other examples of such instructions, steps or operations include the discussion related to the embodiments shown in FIG. 6 and FIG. 7. In some embodiments, the module 452 may comprise a group of modules and/or sub-modules and may not be limited to just a single module but may be implemented as or comprise groups of modules which can communicate with one another and provide operations that can achieve a particular functionality or a variety of functions.

The following discussion is intended to provide a brief, general description of suitable computing environments in which the system and method may be implemented. The disclosed embodiments can be described in the general context of computer-executable instructions, such as program modules, being executed by a single computer. In most instances, a "module" can constitute a software application, but can also be implemented as both software and hardware (i.e., a combination of software and hardware).

Generally, program modules include, but are not limited to, routines, subroutines, software applications, programs, objects, components, data structures, etc., that can perform particular tasks, or which can implement particular data types and instructions. Moreover, those skilled in the art will appreciate that the disclosed method and system may be practiced with other computer system configurations, such as, for example, hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular data type. Modules may be composed of two parts: an interface, which lists the constants, data types, variable, and routines that can be accessed by other modules or routines, and an implementation, which may be private (e.g., accessible only to that module) and which can include source code that actually implements the routines in the module. The term module can also relate to an application, such as a computer program designed to assist in the performance of a specific task, such as implementing the steps, operations or instructions described herein.

The system 100 depicted in FIG. 1 and the method 160 shown in FIG. 3 can be implemented at least in part by a module (or group of modules). The module 452 shown in FIG. 4 can implement for example, the instructions, steps or operations depicted in FIG. 3 with respect to block 162 to block 180 and/or the operations of various components such as, for example, the PLL circuit 150, the processing circuit 110, the antenna system 141 and so on.

Figure 6:
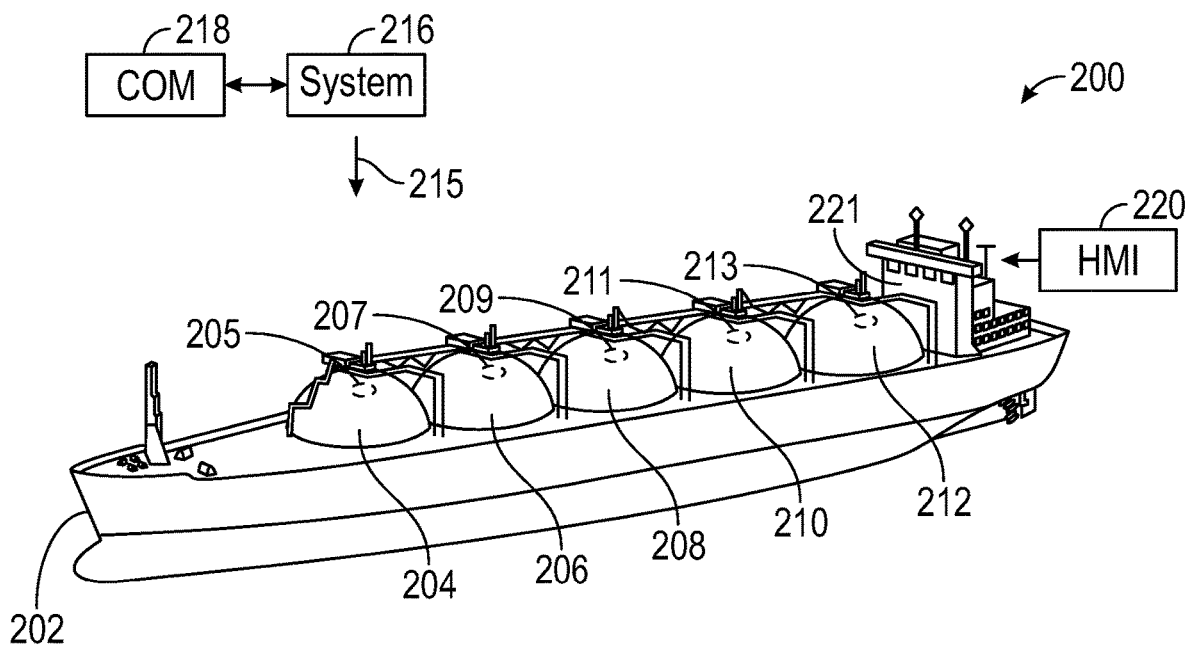
FIG. 6 illustrates a block diagram of an integrated cargo movement safety monitoring system, which can be implemented in accordance with an embodiment.

FIG. 6 illustrates a block diagram of an integrated cargo movement safety monitoring system 200, which can be implemented in accordance with an embodiment. The integrated cargo movement safety monitoring system 200 can include a real-time radar level gauge system 216 that can include a group of imaging phased array radars 205, 207, 209, 211, 213 respectively installed on or in one or more cargo tanks 204, 206, 208, 210, 212 in a vessel 202 (e.g., a tanker). The imaging phased array radars 205, 207, 209, 211, 213 can be configured to support monopulse processing for radar image resolution and mapping of a surface of a material contained in one or more of the cargo tanks 204, 206, 208, 210, 212. Each imaging phased array of the group of imaging phased array radars 205, 207, 209, 211, 213 can provide a narrow-beam with beam scanning/steering and can emit at least one transmit beam that can scan the surface of the material and form an image of the surface including a fluctuation of the surface based on signals returned from the surface.

In FIG. 6, the arrow 215 represents the installation or integration of the integrated cargo movement safety monitoring system 200 into or with the vessel 202. Furthermore, a communications module 219 (as discussed further below) can communicate bidirectionally with the integrated cargo movement safety monitoring system 200 and can also be installed in the vessel 202 as represented by the arrow 215. The communications module 219 is similar to (or can be implemented by) the communications module 154. That is, the communications module 219 may be, for example a wired (e.g., 4-20 mA, Modbus, FF, etc.) and/or a wireless (e.g., Wi-Fi, cellular, etc.) communications module that can provide bidirectional communication with a wireless network (e.g., a Wi-Fi network, a cellular communications network, etc.).

In a maritime embodiment of the integrated cargo movement safety monitoring system 200, weather data can be obtained from maritime weather stations and/or aeronautical weather stations and used for real-time cargo monitoring to provide data indicative of a cargo tank situation with respect to one or more of the cargo tanks 204, 206, 208, 210, 212 in the vessel 202.

In some embodiments of the integrated cargo movement safety monitoring system 200, a data integrated linkage and a cross-correlation between real-time level monitoring data and weather/tide data can be employed, wherein the data integrated linkage is used to assess impact correlated severity with adverse conditions with respect to one or more of the cargo tanks 204, 206, 208, 210, 212 in the vessel 202.

As discussed above, the integrated cargo movement safety monitoring system 216 can further include and/or can be associated with the communications module 218 for broadcasting underlining impact factors with respect to one or more of the cargo tanks 204, 206, 208, 210, 212 in the vessel 202 for others to use the underlining impact factors to optimize and/or divert a current voyage route to a safer voyage route. In some embodiments, an onboard human machine interface (HMI) 220 may be located on/in the vessel 202, which can communicate with a cloud-based server (discussed previously). The HMI 220 is preferably located in a control room/navigation deck in a tower block 221, which typically contains areas such as cabins, a control room/navigation deck and so on.

The vessel depicted in FIG. 6 is depicted as a tanker ship that can transport hydrocarbons, such as liquified natural gas, contained in the various cargo tanks 204, 206, 208, 210, 212. It should be appreciated, however, that the disclosed embodiments are not limited to the particular type of vessel 202 shown in FIG. 6. Embodiments may be implemented in other types of maritime transportation vessels, such as, for example, the vessel 302 shown in FIG. 7.

Figure 7:
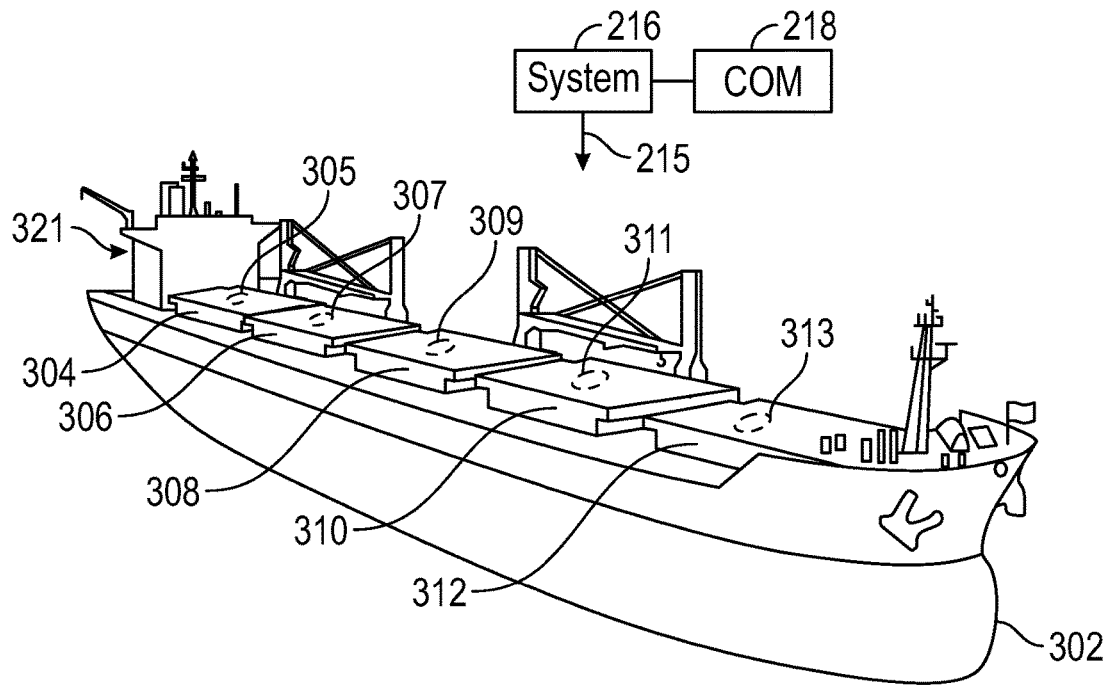
FIG. 7 illustrates a block diagram of the integrated cargo movement safety monitoring system shown in FIG. 6, in accordance with another embodiment.

FIG. 7 illustrates a block diagram of the integrated cargo movement safety monitoring system 200, implemented in accordance with another embodiment. That is, the integrated cargo movement safety monitoring system 200 discussed above with respect to FIG. 6 can include the real-time radar level gauge system 216 and a group of imaging phased array radars 305, 307, 309, 311, 313 respectively installed on or in one or more cargo tanks 304, 306, 308, 310, 312 in a vessel 302 (e.g., a tanker). The imaging phased array radars 305, 307, 309, 311, 313 can be configured to support monopulse processing for radar image resolution and mapping of a surface of a material contained in one or more of the cargo tanks 304, 306, 308, 310, 312, as discussed previously. Each imaging phased array of the group of imaging phased array radars 305, 307, 309, 311, 313 can provide a narrow-beam with beam scanning/steering and can emit at least one transmit beam that can scan the surface of the material and form an image of the surface including a fluctuation of the surface based on signals returned from the surface.

The onboard human machine interface (HMI) 220 discussed above with respect to FIG. 6 may be located on/in the vessel 302, which can communicate with a cloud-based server (discussed previously). The HMI 220 is preferably located in a control room/navigation deck in the tower block 321 of the vessel 302. Note that the vessel 302 depicted in FIG. 7 is an example of a petroleum tanker in which the petroleum is contained within cargo/storage tanks 304, 306, 308, 310, 312 that are primarily located within the vessel itself rather than above deck as is the case with the vessel 202 shown in FIG. 6. The HMI 220 may communicate with the communications module 218, for example, to access the aforementioned could-based server through a wireless communication network (e.g., a satellite network, cellular network, wi-fi network, etc.).

Certain methods or process blocks may be omitted in some implementations. The methods and processes described herein are also not limited to any particular sequence, and the blocks or states relating thereto can be performed in other sequences that may be appropriate. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments.

It will also be appreciated that various items are illustrated as being stored in memory or on storage while being used, and that these items or portions thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network or a portable media article to be read by an appropriate drive or via an appropriate connection. The systems, modules and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, embodiments may be practiced with other computer system configurations.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having" and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some or all of the elements in the list.

While certain example embodiments have been described, these embodiments have been presented by way of example only and are not intended to limit the scope of the invention. Thus, nothing in the foregoing description is intended to imply that any particular feature, characteristic, step, module or block is necessary or indispensable. Indeed, the novel methods and systems described herein may be embodied in a variety of other forms; furthermore, various omissions, substitutions and changes in the form of the methods and systems described herein may be made without departing from the spirit of the invention disclosed herein. The accompanying claims and their equivalents are intended to cover such forms or modifications as would fall within the scope and spirit of certain of the invention disclosed herein.

What is claimed is:

1. A radar level gauge system, comprising:
   an antenna system comprising an imaging phased array in an isolated antenna arrangement, the antenna system is configured for monopulse processing for radar image resolution and mapping of a surface of a material;
   wherein the imaging phased array provides a narrow-beam with beam steering and emits at least one transmit beam that scans the surface of the material and forms the mapping of the surface of the material, the mapping comprising a 3D volumetric model that includes an image of a surface profile of the surface based on signals returned from the surface,
   wherein, the antenna system is configured to:
   generate monopulse signals based on the monopulse processing to determine unwanted reflections and obstacles that interfere with the at least one transmit beam,
   determine an optimum beam position by differentiating the unwanted reflections and the obstacles from the signals returned from the surface, and
   wherein the imaging phased array and the antenna system are protected from condensation and contamination from chemicals and viscous materials.

2. The radar level gauge system of claim 1, wherein the 3D volumetric model comprises data indicative of a height, a slope and horizontal dimensions with respect to the material and the surface of the material.

3. The radar level gauge system of claim 1, wherein the material is contained in at least one of: a tank or a field in open air.

4. The radar level gauge system of claim 1, wherein the isolated antenna arrangement galvanic isolated.

5. The radar level gauge system of claim 1, wherein the antenna system further comprises a plurality of receive antenna elements and a plurality of transmit antenna elements.

6. The radar level gauge system of claim 1 further comprising a phased-lock loop (PLL) circuit that facilitates PLL wideband level radar with galvanic isolation gauging for the isolated antenna arrangement.

7. The radar level gauge system of claim 6 further comprising:
   processing circuitry that outputs a signal that is fed as input to the PLL circuit, wherein the PLL circuit provides a signal to a voltage controlled oscillator circuit;
   a plurality of low noise amplifiers electrically connected to the plurality of receive antenna elements and a plurality of mixers electrically connected to the plurality of low noise amplifiers;
   a plurality of phase shifters connected electronically to the plurality of mixers, wherein plurality of mixers output signals that are fed as input to the plurality of phase shifters; and
   a plurality of amplifiers connected electronically to the plurality of phase shifters, wherein the plurality of amplifiers provides signals to a multi-channel analog-to-digital converter, which in turn output signals that are input to the processing circuitry.

8. The radar level gauge system of claim 1, wherein azimuth and elevation monopulse signals are used to determine a location of obstruction reflectors that interfere with target signals emitted by the imaging phased array of the antenna system.

9. The radar level gauge system of claim 1 wherein power management signals are provided to the radar level gauge system.

10. The radar level gauge system of claim 1 wherein the radar level gauge system communicates bidirectionally with a data network.

11. A method of operating a radar level gauge system, comprising:
    providing an antenna system comprising an imaging phased array in an isolated antenna arrangement that supports monopulse processing for radar image resolution and mapping of a surface of a material;
    generating from the imaging phased array a narrow-beam with beam steering; and
    emitting at least one transmit beam that scans the surface of the material and forms the mapping of the surface, the mapping comprising a 3D volumetric model that includes an image of a surface profile of the surface based on signals returned from the surface;
    generating monopulse signals based on the monopulse processing to determine unwanted reflections and obstacles that interfere with the at least one transmit beam,
    determining an optimum beam position by differentiating the unwanted reflections and the obstacles from the signals returned from the surface.

12. The method of claim 11, wherein the imaging phased array and the antenna system are protected from condensation and contamination from chemicals and viscous materials.

13. The method of claim 11 providing from the 3D volumetric model, data indicative of a height, a slope and horizontal dimensions with respect to the material and the surface of the material.

14. The method of claim 11 wherein:
    the material is contained in at least one of: a tank or a field in open air; and
    the isolated antenna arrangement is and galvanic isolated.

15. The method claim 11, wherein the antenna system further comprises a plurality of receive antenna elements and a plurality of transmit antenna elements.

* * * * *